US008012536B2

(12) United States Patent
Shenai-Khatkhate et al.

(10) Patent No.: US 8,012,536 B2
(45) Date of Patent: Sep. 6, 2011

(54) METHOD OF FORMING METAL-CONTAINING LAYER USING ORGANOMETALLIC COMPOUNDS

(75) Inventors: Deodatta Vinayak Shenai-Khatkhate, Danvers, MA (US); Huazhi Li, Somerville, MA (US); Qing Min Wang, North Andover, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 689 days.

(21) Appl. No.: 12/156,898

(22) Filed: Jun. 5, 2008

(65) Prior Publication Data

US 2008/0305260 A1  Dec. 11, 2008

Related U.S. Application Data

(60) Provisional application No. 60/933,282, filed on Jun. 5, 2007.

(51) Int. Cl.
*C23C 16/18* (2006.01)
(52) U.S. Cl. ............... 427/250; 427/255.31; 117/84; 117/88
(58) Field of Classification Search .............. 427/250, 427/255.31; 117/84, 88
See application file for complete search history.

(56) References Cited

U.S. PATENT DOCUMENTS

| | | | |
|---|---|---|---|
| 6,281,124 | B1 | 8/2001 | Vaartstra |
| 2005/0042372 | A1 | 2/2005 | Denk et al. |
| 2006/0035462 | A1 | 2/2006 | Millward |
| 2006/0046521 | A1 | 3/2006 | Vaartstra et al. |
| 2006/0141155 | A1* | 6/2006 | Gordon et al. ........... 427/255.19 |
| 2008/0003359 | A1 | 1/2008 | Gordon et al. |
| 2009/0017208 | A1* | 1/2009 | Shenai-Khatkhate et al. ........ 427/255.38 |
| 2011/0064879 | A1* | 3/2011 | Wang et al. ............. 427/255.28 |

FOREIGN PATENT DOCUMENTS

| | | |
|---|---|---|
| EP | 1 921 061 | 5/2008 |
| WO | WO 95/04063 | 2/1995 |
| WO | WO 2007/147020 | 12/2007 |
| WO | WO 2008/002546 | 1/2008 |

OTHER PUBLICATIONS

Cole, Marcus L., et al., "Structural Studies of N,N'-Di(ortho-fluorophenyl)formamidine Group I Metallation". Chem. Eur. J. 2003, 9, No. 2, pp. 415-424.*
Brym, Markus, et al., "Ligand effects in the syntheses and structures of novel heteroleptic and homoleptic bismuth(III) formamidinate complexes". Dalton Transactions, 2007, pp. 3282-3288.*
Lyhs, Benjamin, et al., "Heteroleptic Amidinate Complexes of Heavy Group 15 Elements—Synthesis, X-ray Crystal Structures and Theoretical Calculations." Eur. J. Inorg. Chem. 2009, pp. 2247-2253.*
Teng, Weijie, et al., "Syntheses, Structures, and Reactivities of Heteroleptic Magnesium Amide Thiolates". Inorganic Chemistry (2000) vol. 39, Issue 17, pp. 3875-3880.*
Hubert-Pfalzgraf et al.; "Niobium and tantalum derivatives with bidentate nitrogen ligands as potential precursors to nitrides"; Journal De Physique IV, 09(No. PR8), 1999, pp. 953-958.
Brym et al.; "Ligand effects in the synthesis and structures of novel heteroleptic and homoleptic bismuth (III) formamidinate complexes"; Dalton Transactions 2007 Royal Society of Chemistry; Thomas Graham House; Science Park GB, No. 30; 2007; pp. 3282-3288.

* cited by examiner

*Primary Examiner* — Bret Chen
(74) *Attorney, Agent, or Firm* — S. Matthew Cairns

(57) ABSTRACT

Methods of forming metal-containing layers are provided where heteroleptic organometallic compounds containing at least one formamidinate ligand are conveyed in a gaseous form to a reactor; and films comprising a metal are deposited on a substrate. These heteroleptic organometallic compounds have improved properties over conventional vapor deposition precursors. Such compounds are suitable for use as vapor deposition precursors including direct liquid injection. Also provided are methods of depositing thin films, such as by ALD and CVD, using such compounds or their solutions in organic solvents.

10 Claims, No Drawings

METHOD OF FORMING METAL-CONTAINING LAYER USING ORGANOMETALLIC COMPOUNDS

This application claims the benefit of provisional patent application Ser. No. 60/933,282, filed on Jun. 5, 2007.

The present invention relates generally to the field of organometallic compounds. In particular, the present invention relates to the field of organometallic compounds useful for chemical vapor deposition or atomic layer deposition of thin films.

In atomic layer deposition ("ALD") processes, conformal thin films are deposited by exposing a surface to alternating vapors of two or more chemical reactants. Vapor from a first precursor (also referred to as organometallic compound, source or reactant) is brought to the surface onto which the desired thin film is to be deposited. Any unreacted vapor is then removed from the system under vacuum. Next, vapor from a second precursor is brought to the surface and allowed to react with the first precursor, with any excess second precursor vapor being removed. Each step in the ALD process typically deposits a monolayer of the desired film. This sequence of steps is repeated until the desired film thickness is obtained. In general, ALD processes are performed at low temperatures, such as from 200 to 400° C. The exact temperature range will depend on the particular film to be deposited as well as on the particular precursors employed. ALD processes have been used to deposit pure metals as well as metal oxides, metal nitrides, metal carbide nitrides, and metal silicide nitrides.

ALD precursors must be sufficiently volatile to ensure a sufficient concentration of the precursor vapor in the reactor to deposit a monolayer on the substrate surface within a reasonable period of time. The precursors must also be sufficiently stable to be vaporized without premature decomposition and unwanted side reactions, but must also be sufficiently reactive to form the desired film on the substrate. With such a required balance of volatility and stability properties, there is an overall lack of suitable precursors.

Conventional precursors are homoleptic, i.e. they have a single ligand group. Homoleptic precursors offer uniform chemical characteristics, thus offering the inherent advantage of matching and harmonizing the functionality of ligand with the deposition process. However, the use of only a single ligand group offers less control over other paramount precursor characteristics, such as the shielding of metal center, that governs the surface reactions (e.g. chemisorption) and gas phase reaction (e.g. reaction with second complementary precursor), adjusting the volatility of precursor, and achieving required thermal stability for the precursor. U.S. Pat. App. No. 2005/0042372 (Denk et al.) discloses certain amidinate compounds, including certain formamidinate compounds, as suitable precursors for ALD. These compounds contain only a single amidinate or formamidinate ligand (i.e., they are homoleptic). Such homoleptic amidinate compounds may optionally include a neutral donor ligand which is shown in paragraphs [0033] and [0035] of U.S. Pat. App. No. 2005/0042372 as not being covalently bonded to the metal center but instead as a coordinate interaction with the metal center. The homoleptic amidinates of U.S. Pat. App. No. 2005/0042372 do not provide the balance of volatility and thermal stability (or other properties) needed under certain ALD conditions. The films produced by using such homoleptic amidinate compounds are often found to be contaminated with carbon which increases the resistivity of the film. Carbon incorporation is generally correlated with the breakdown of less stable organic moieties into more stable smaller fragments during the deposition process. The smaller fragments may get trapped within the thin films being deposited, or may produce particles in the film surface leading to surface defects and poor morphology. Furthermore, the volatility of certain homoleptic amidinates is too low to be practically utilized in ALD. Certain conventional ALD processes utilize direct liquid injection process, in which the desired precursor compound is combined with a suitable organic solvent. However, amidinate compounds typically are insufficiently soluble in such solvents to be of practical use in direct liquid injection processes. There remains a need for suitable sources that are appreciably volatile, thermally stable and sufficiently organic solvent-soluble precursors so as to meet ALD requirements and produce films that are substantially carbon-free and particle-free.

Certain heteroleptic organometallic compounds having a formamidinate ligand are known as polymerization catalysts. However, such organometallic compounds have not been used as precursors for the vapor deposition of metal-containing films.

The present invention provides a method of forming a metal-containing layer on a substrate including: providing a substrate in a vapor deposition reactor; conveying a heteroleptic formamidinate compound in a gaseous form to the reactor; and depositing a film including the metal on the substrate. The heteroleptic formamidinate compounds include a metal, a formamidate ligand and an anionic ligand. More than one formamidinate ligand may be present in the organometallic compounds. Also, the organometallic compounds may have more than one anionic ligand.

Also provided by the present invention is a method of depositing a film including the steps of: providing a substrate in a reactor; conveying as a first precursor compound a heteroleptic formamidate compound in a gaseous form to the reactor; chemisorbing the first precursor compound on the surface of the substrate; removing any non-chemisorbed first precursor compound from the reactor; conveying a second precursor in a gaseous form to the reactor; reacting the first and second precursors to form a film on the substrate; and removing any unreacted second precursor.

The present invention further provides a vapor delivery cylinder including a heteroleptic foramidinate compound.

Also provided by the present invention is a method for preparing a metal formamidinate compound including: reacting a trialkylorthoformate with acetic acid and an alkylamine to provide a di-alkylformamidine acetate; and reacting the di-alkylformamidine acetate with a metal alkoxide to provide a metal di-alkylformamidinate.

As used throughout this specification, the following abbreviations shall have the following meanings, unless the context clearly indicates otherwise: ° C.=degrees centigrade; ppm=parts per million; M=molar; Me=methyl; Et=ethyl; i-Pr=iso-propyl; n-Bu=n-butyl; s-Bu=sec-butyl; t-Bu=tert-butyl; t-Am=tert-amyl; DAA=dialkylamino including di(silyl-substituted alkyl)amino, disilylamino, or di(alkyl-substituted silyl)amino; EMA=ethylmethylamino; Cp=cyclopentadienyl; MeCp=methylcyclopentadienyl; EtCp=ethylcyclopentadienyl; CO=carbon monoxide; Bz=benzene; AMD=amidinato; PAMD=phoshoamidinato; DMA=dimethylamino; TMG=tetramethylguanidinato; PMDETA=pentamethyldiethylenetriamine; and THF=tetrahydrofuran.

"Halogen" refers to fluorine, chlorine, bromine and iodine and "halo" refers to fluoro, chloro, bromo and iodo. Likewise, "halogenated" refers to fluorinated, chlorinated, brominated and iodinated. "Alkyl" includes linear, branched and cyclic alkyl. Likewise, "alkenyl" and "alkynyl" include linear, branched and cyclic alkenyl and alkynyl, respectively. The articles "a" and "an" refer to the singular and the plural.

Unless otherwise noted, all amounts are percent by weight and all ratios are molar ratios. All numerical ranges are inclusive and combinable in any order except where it is clear that such numerical ranges are constrained to add up to 100%.

The organometallic compounds of the present invention, known generally as formamidinates or formidinate compounds, contain a metal, at least one formamidate ligand and at least one anionic ligand. The anionic ligands have extra electrons so that they are negatively charged. Such anionic ligands provide increased bonding interaction as compared to a corresponding neutral ligand. Suitable formamidate ligands are those of Formula 1, where $R^1$ and $R^2$ are independently selected from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl.

Formula 1

In general, the present organometallic compounds have the formula $(R^1NC(H)NR^2)_nM^{+m}L^1_{(m-n)}L^2_p$, wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl; M=a metal; $L^1$=an anionic ligand; $L^2$=a neutral ligand; m=the valence of M; n=1-6; p=0-3 and m is greater than n. The subscript "n" represents the number of formamidinate ligands in the present compounds. Exemplary groups for each of $R^1$ and $R^2$ include without limitation methyl, ethyl, propyl, butyl, vinyl, allyl, butenyl, acetylenyl, propynyl, and substituted- or unsubstituted-aryl groups. Exemplary aryl groups include, but are not limited to, phenyl, methylphenyl, ethylphenyl, iso-propylphenyl, benzyl, tolyl and xylyl. In particular, certain aryl groups substituted with one or more branched or sterically bulky alkyl or alkoxy groups, such as tert-butyl, iso-butyl, iso-propyl, tert-butoxy, iso-butoxy and iso-propoxy, or $C_1$-$C_{12}$ alkoxy groups may be suitably employed in the present invention A wide variety of metals may suitably be used to form the present formamidinate compounds. The metal in the present organometallic compounds may be any one that is suitable for use in a vapor deposition process, such as ALD or chemical vapor deposition ("CVD"). Typically, M is chosen from a Group 2 to Group 16 metal, which includes the lanthanide metals. More typically, M is a metal chosen from Groups 3 to 10, 13, and 14. Still more typically, M is a metal chosen from Groups 3 to 10 and 13, silicon and germanium. As used herein, the term "metal" includes the metalloids boron, silicon, arsenic, selenium and tellurium but does not include carbon, nitrogen, phosphorus, oxygen and sulfur. Exemplary metals useful in the present organometallic compounds include, but are not limited to, Be, Mg, Sr, Ba, Al, Ga, In, Si, Ge, Sb, Bi, Se, Te, Po, Zn, Sc, Y, Lu, La, lanthanide metals, Ti, Zr, Hf, Nb, W, Mn, Co, Ni, Ru, Rh, Pd, Ir and Pt. Particularly suitable metals include, without limitation, Al, Ga, In, Si, Ge, La, lanthanide metals, Ti, Zr, Hf, Nb, W, Mn, Co, Ni, Ru, Rh, Pd, Ir and Pt.

A wide variety of anionic ligands ($L^1$) may be used in the present invention. Such ligands bear a negative charge. Suitable ligands include, without limitation: hydride, halide, azide, alkyls, alkenyl, alkynyl, amino, alkylamino, dialkylamino, di(silyl-alkyl)amino, disilylamino, di(alkyl-silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, beta-diketonato, beta-diiminato, beta-ketoiminato, dialkylamino, di(silyl-alkyl)amino, disilylamino, or di(alkyl-silyl)amino, pyrazolates, guanidinates, phosphoguanidinates, alkylamidinates, arylamidinates, and phosphoamidinates. Any of such ligands may be optionally substituted such as by replacing one or more hydrogens with another substituent group such as halo, amino, disilylamino and silyl. Exemplary anionic ligands include, but are not limited to: $(C_1-C_{10})$alkyl such as methyl, ethyl, propyl, butyl, pentyl, hexyl, cyclopropyl, cyclopentyl and cyclohexyl; $(C_2-C_{10})$alkenyl such as ethenyl, allyl, and butenyl; $(C_2-C_{10})$alkynyl such as acetylenyl and propynyl; $(C_1-C_{10})$alkoxy such as methoxy, ethoxy, propoxy, and butoxy; $(C_1-C_{10})$alkylamino such as methylamino, ethylamino and propylamino; di$(C_1-C_{10})$alkylamino such as dimethylamino, diethylamino, ethylmethylamino and dipropylamino; cyclopentadienyls such as cyclopentadienyl, methylcyclopentadienyl, ethylcyclopentadienyl and pentamethylcyclopentadienyl; di$(C_1-C_{10})$alkylamino$(C_1-C_{10})$ alkoxy such as dimethylaminoethoxy, diethylaminoethoxy, dimethylaminopropoxy, ethylmethylaminopropoxy and diethylaminopropoxy; silyls such as $(C_1-C_{10})$alkylsilyls and $(C_1-C_{10})$alkylaminosilyls; guanidinates such as tetramethylguanidinates and tetraethylguanidinates; and phosphoamidinates such as N,P-dimethyl-methylphosphoamidinato, N,P-diethyl-methylphosphoamidinato, N,P-diethyl-ethylphosphoamidinato, N,P-di-iso-propyl-methylphosphoamidinato, N,P-di-iso-propyl-iso-propylphosphoamidinato, and N,P-dimethyl-phenylphosphoamidinato. Preferred anionic ligands are cyclopentadienyls, di$(C_1-C_{10})$alkylamino, amidinates, and $(C_1-C_{10})$alkoxy. When two or more anionic ligands are present, such ligands may be the same or different.

Neutral ligands ($L^2$) may be optional in the present compounds. Such neutral ligands do not bear an overall charge and may function as stabilizers. Neutral ligands include, without limitation, CO, NO, nitrogen ($N_2$), amines, phosphines, alkylnitriles, alkenes, alkynes, and aromatic compounds. The term "alkene" includes any aliphatic compound having one or more carbon-carbon double bonds. Exemplary neutral ligands include, but are not limited to: $(C_2-C_{10})$alkenes such as ethene, propene, 1-butene, 2-butene, 1-pentene, 2-pentene, 1-hexene, 2-hexene, norbornene, vinylamine, allylamine, vinyltri$(C_1-C_6)$alkylsilane, divinyldi$(C_1-C_6)$alkylsilane, vinyltri$(C_1-C_6)$alkoxysilane and divinyldi$(C_1-C_6)$alkoxysilane; $(C_4-C_{12})$dienes such as butadiene, cyclopentadiene, isoprene, hexadiene, octadiene, cyclooctadiene, norbornadiene and α-terpinene; $(C_6-C_{16})$trienes; $(C_2-C_{10})$ alkynes such as acetylene and propyne; and aromatic compounds such as benzene, o-xylene, m-xylene, p-xylene, toluene, o-cymene, m-cymene, p-cymene, pyridine, furan and thiophene. The number of neutral ligands depends upon the particular metal chosen for M. When two or more neutral ligands are present, such ligands may be the same or different.

The present formamidinate compounds may be prepared by a variety of methods known in the art. For example, the general procedures of Zhang et al., *Organometallics*, 2004 23), pg. 3512, may be used. Also, the general procedures disclosed in U.S. Pat. No. 5,502,128 (Rausch et al.) and International Patent Application WO 2004/46417 for the manufacture of certain amidinates may be modified by those skilled in the art to prepare the present formamidinates. The present compounds may be prepared by reacting a lithium formamidinate salt with a metal halide in a suitable solvent such as ethers. Such reaction may be performed over a range of temperatures, with room temperature being suitable for certain reactions. In an alternate synthesis of the present compounds, an alkyl lithium may be first reacted with a metal halide in a suitable solvent, such as THF, and at a suitable temperature, such as room temperature, followed by reaction with a formamidine in a suitable solvent, typically the same solvent as used for the first reaction.

Alternatively, formamidine ligands may be prepared by reacting a suitable carbodiimide compound (alkyl and/or aryl or dialkylamino) with triethylsilane in the presence of a palladium catalyst, then performing and alcoholysis step to form free formamidine. Palladium dichloride is a particularly suitable palladium catalyst. Lower alcohols, such as methanol and ethanol, are typically used in the alcoholysis step. Exemplary carbodiimide compounds include, without limitation, those having the formula $R^3$—N=C=N—$R^4$. Each of $R^3$ and $R^4$ is independently chosen from H, $(C_1-C_6)$alkyl, $(C_2-C_6)$alkenyl, $(C_2-C_6)$alkynyl, dialkylamino, di(silyl-alkyl) amino, disilylamino, di(alkyl-silyl)amino, and aryl. Exemplary carbodiimides include, without limitation, di-isopropylcarbodiimide, di-tert-butylcarbodiimide, di-methylcarbodiimide, and N-tert-butyl-N'-ethylcarbodiimide. Suitable carbodiimides are generally commercially available, such as from Sigma-Aldrich (Milwaukee, Wis.) or may be prepared by a variety of methods, such as those disclosed above. The formamidine ligands prepared by the above reaction typically have the formula H($R^1$NCHN$R^2$), wherein $R^1$ and $R^2$ are independently chosen from H, $(C_1-C_6)$alkyl, $(C_2-C_6)$alkenyl, $(C_2-C_6)$alkynyl, dialkylamino, di(silyl-alkyl) amino, disilylamino, di(alkyl-silyl)amino, and aryl. The above reaction may be performed at a variety of temperatures, such as at reflux. Typically, the reaction is completed within several hours to a few days.

The present metal formamidinate organometallic compounds can be prepared by the metathesis reaction of metal salts (generally halides) with alkali metal formamidinates. Alkali metal formamidinates may be prepared by reacting a formamidine compound with an alkyl alkali metal reagent (such as n-butyl lithium, methyl lithium and tertiary butyl lithium), an alkali metal hydride (such as sodium hydride and potassium hydride) or an alkali metal amide (such as sodium amide). Alternatively, metal formamidinates can be prepared by the exchange reaction between metal dialkylamides and free formamidine in the presence of an organic solvent. The above reactions are generally carried out under inert atmosphere, such as under nitrogen, argon or a mixture thereof. Typically, the organic solvents used in such reactions are substantially free of metallic and oxygenated impurities. By "substantially free", it is meant that the organic solvents contain less than 0.005% of metallic and oxygenated impurities.

Metal formamidinate compounds may be prepared by: reacting a trialkylorthoformate with acetic acid and an organoamine to provide a di-alkylformamidine acetate; and reacting the di-alkylformamidine acetate with a metal-containing base to provide a metal di-alkylformamidinate. Suitable orthoformates are tri$(C_1-C_3)$alkylorthoformates, such as triethylorthoformate. A wide variety of organoamines may suitably be employed, such as $(C_1-C_8)$alkylamines and arylamines. Such organoamines are primary amines. Exemplary alkylamines include, without limitation, methylamine, ethylamine, n-propylamine, iso-propylamine, n-butylamine, iso-butylamine and tert-butylamine. Suitable metal-containing bases include, but are not limited to, sodium metal, sodium-potassium alloy, sodium hydride, potassium hydride, lithium hydride, metal alkyls such as metal $(C_1-C_6)$alkyls, aryl metals such as phenyl lithium, and metal alkoxides such as metal $(C_1-C_{15})$alkoxides.

The present organometallic compounds are particularly suitable for use as precursors for the vapor deposition of metal or metal oxide or metal nitride or metal silicate or metal silicon oxynitride thin films. Such compounds may be used in a variety of CVD processes as well as in a variety of ALD processes. Two or more of such organometallic compounds may be used in a CVD or ALD process. When two or more organometallic compounds are used, such compounds may contain the same metal but having different ligands, or may contain different metals and have the same ligands, or may contain different metals and different ligands. The selection of such second organometallic compound is well within the ability of one skilled in the art.

Bubblers (also known as cylinders) are the typical delivery devices used to provide organometallic compounds in the vapor phase to a deposition reactor. Such bubblers typically contain a fill port, a gas inlet port and an outlet port which is connected to a deposition chamber. A carrier gas typically enters the bubbler through the gas inlet port and entrains or picks up precursor vapor. The gas containing precursor vapor then exits the bubbler through the outlet port and is conveyed to the deposition chamber. A variety of carrier gases may be used, such as hydrogen, helium, nitrogen, argon and mixtures thereof.

A wide variety of bubblers may be used, depending upon the particular deposition apparatus used. When the precursor compound is a solid, the bubblers disclosed in U.S. Pat. No. 6,444,038 (Rangarajan et al.) and U.S. Pat. No. 6,607,785 (Timmons et al.), as well as other designs, may be used. For liquid precursor compounds, the bubblers disclosed in U.S. Pat. No. 4,506,815 (Melas et al.) and U.S. Pat. No. 5,755,885 (Mikoshiba et al.) may be used, as well as other liquid precursor bubblers. The source compound is maintained in the bubbler as a liquid or solid. Solid source compounds are typically vaporized or sublimed prior to transportation to the deposition chamber. Bubblers for use with ALD processes may have pneumatic valves at the inlet and outlet ports to facility opening and closing as required to provide the necessary vapor pulses.

In conventional CVD processes, a bubbler for supplying a liquid precursor, as well as certain bubblers for supplying solid precursors, will contain a dip tube which is connected to the gas inlet port. In general, the carrier gas is introduced below the surface of the organometallic compound and travels upward through the source compound to the headspace above it, entraining or carrying vapor of the precursor compound in the carrier gas.

Precursors used in ALD processes are often liquids, low melting solids, or solids formulated in a solvent. To handle these types of precursors, bubblers used in ALD processes may contain a dip tube connected to the outlet port. Gas enters these bubblers through the inlet, pressurizes the bubbler and forces the precursor up the dip tube and out of the bubbler.

The present invention provides a delivery device including the organometallic compound described above. In one embodiment, the delivery device includes a vessel having an elongated cylindrical shaped portion having an inner surface having a cross-section, a top closure portion and a bottom closure portion, the top closure portion having an inlet opening for the introduction of a carrier gas and an outlet opening, the elongated cylindrical shaped portion having a chamber containing the organometallic compound described above.

The present invention provides a device for feeding a fluid stream saturated with the heteroleptic formamidiate compound described above to a chemical vapor deposition system including a vessel having an elongated cylindrical shaped portion having an inner surface having a cross-section, a top closure portion and a bottom closure portion, the top closure portion having an inlet opening for the introduction of a carrier gas and an outlet opening, the elongated cylindrical shaped portion having a chamber containing the organometallic compound; the inlet opening being in fluid communication with the chamber and the chamber being in fluid communication with the outlet opening. In particular, the organometallic compound has the general formula $(R^1NCHNR^2)_n M^{+m} L^1_{(m-n)} L^2_p$, wherein $R^1$ and $R^2$ are independently chosen from H, $(C_1-C_6)$alkyl, $(C_2-C_6)$alkenyl, $(C_2-C_6)$alkynyl, dialkylamino, di(silyl-alkyl)amino, disilylamino, di(alkyl-silyl)amino, and aryl; M=a metal; $L^1$=an anionic ligand; $L^2$=a neutral ligand; m=the valence of M; n=1-6; p=0-3 and m is greater than n. Also provided by the present invention is an apparatus for chemical vapor deposition of metal films including one or more devices for feeding a fluid stream saturated with the organometallic compound described above.

The deposition chamber is typically a heated vessel within which is disposed at least one, and possibly many, substrates. The deposition chamber has an outlet, which is typically connected to a vacuum pump in order to draw by-products out of the chamber and to provide a reduced pressure where that is appropriate. Metalorganic CVD ("MOCVD") can be conducted at atmospheric or reduced pressure. The deposition chamber is maintained at a temperature sufficiently high to induce decomposition of the source compound. The typical deposition chamber temperature is from 200 to 1200° C., more typically from 200 to 600° C., the exact temperature selected being optimized to provide efficient deposition. Optionally, the temperature in the deposition chamber as a whole can be reduced if the substrate is maintained at an elevated temperature, or if other energy such as plasma is generated by a radio frequency source.

Suitable substrates for deposition, in the case of electronic device manufacture, may be silicon, silicon germanium, silicon carbide, gallium nitride, gallium arsenide, indium phosphide, and the like. Such substrates are particularly useful in the manufacture of integrated circuits and memory chips.

Deposition is continued for as long as desired to produce a film having the desired properties. Typically, the film thickness will be from several hundred to several thousand angstroms or more when deposition is stopped.

Thus, the present invention provides a method for depositing a metal film including the steps of: a) providing a substrate in a vapor deposition reactor; b) conveying as a precursor the heteroleptic formamidinate compound described above in a gaseous form to the reactor; and c) depositing a film including a metal on the substrate. In a typical CVD process, the above described method further includes the step of decomposing the precursor in the reactor.

Thin metal-containing films (metal or metal oxide or metal nitride or metal silicate or metal silicon oxynitride) are produced by ALD with almost perfect stoichiometry by alternately subjecting the substrate, one at a time, to the vapor of precursor compounds of each of the elements of which the film is formed. In ALD processes, a substrate is subjected to the vapor of a first precursor which can react with the surface of the substrate at a temperature sufficiently high for such reaction to occur whereby a single atomic layer of the first precursor (or metal contained therein) is formed on the surface of the substrate, and subjecting the thus formed surface with the first precursor atomic layer thereon to the vapor of a second precursor which reacts with the first precursor at a temperature sufficiently high for such reaction to occur whereby a single atomic layer of the desired metal film is formed on the surface of the substrate. This procedure can be continued by alternately using the first and second precursors until the film that is formed reaches a desire to thickness. The temperatures used in such ALD processes are typically lower than those employed in MOCVD process and may be in the range of 200 to 400° C., although other suitable temperatures may be employed depending upon the precursors chosen, the film to be deposited, and on other criteria known to those skilled in the art.

An ALD apparatus typically includes a vacuum chamber means to provide an evacuated atmosphere, a pair of means situated in the vacuum chamber means, the pair of means including a support means for supporting at least one substrate and a source means for forming sources for as least two vapors of two different precursors, respectively, and operating means operatively connected with one of the pair of means for operating the one means with respect to the other of the pair of means for providing on the substrate first a single atomic layer of one of the precursors and then a single atomic layer of the other precursor. See, e.g., U.S. Pat. No. 4,058,430 (Suntola) for a description of an ALD apparatus.

In a further embodiment, the present invention provides a method of depositing a film including the steps of: providing a substrate in a vapor deposition reactor; conveying as a first precursor the organometallic compound described above in a gaseous form to the reactor; chemisorbing the first precursor compound on the surface of the substrate; removing any non-chemisorbed first precursor compound from the reactor; conveying a second precursor in a gaseous form to the reactor; reacting the first and second precursors to form a film on the substrate; and removing any unreacted second precursor. The alternating steps of conveying the first and second precursors and step of reacting the first and second precursors being repeated until a film of the desired thickness is obtained. The step of removing a precursor from the reactor may include one or more of evacuating the reactor under vacuum and purging the reactor using a non-reactant gas and/or solvent vapor. The second precursor may be any suitable precursor that reacts with the first precursor to form the desired film. Such second precursors may optionally contain another metal. Exemplary second precursors include, but are not limited to, oxygen, ozone, water, peroxide, alcohols, nitrous oxide and ammonia.

When the present organometallic compounds are to be used in ALD processes or in direct liquid injection processes, they may be combined with an organic solvent. Any organic solvents which are both soluble and suitably inert to the organometallic compound, as well as match the vapor pressure, thermal stability, and polarity of the organometallic compound can be employed. Exemplary organic solvents include, without limitation, aliphatic hydrocarbons, aromatic hydrocarbons, linear alkyl benzenes, halogenated hydrocarbons, silylated hydrocarbons, alcohols, ethers, glymes, glycols, aldehydes, ketones, carboxylic acids, sulphonic acids, phenols, esters, amines, alkylnitrile, thioethers, thioamines, cyanates, isocyanates, thiocyanates, silicone oils, nitroalkyl, alkylnitrate, and mixtures thereof. Suitable solvents include tetrahydrofuran, diglyme, n-butyl acetate, octane, 2-methoxyethyl acetate, ethyl lactate, 1,4-dioxane, vinyltrimethylsilane, pyridine, mesitylene, toluene, and xylene. Mixtures of organic solvents may be used. When used in direct liquid injection processes, the concentration of the organometallic compound is typically in the range of 0.05 to 0.25 M, and more typically 0.05 to 0.15 M. The organometallic compound/organic solvent compositions may be in the form of solutions, slurries or dispersions, and preferably solutions.

Compositions including the present organometallic compound and an organic solvent are suitable for use in vapor deposition processes employing direct liquid injection. Suitable direct liquid injection processes are those described in U.S. Patent Application No. 2006/0110930 (Senzaki).

Further provided by the present invention is a method for manufacturing an electronic device including the step of depositing a metal-containing film using any one of the above described methods.

The present invention provides an enabling vapor deposition process using a heteroleptic formamidinate precursor, particularly for ALD, which have a suitable balance of functionality, desired thermal stability, higher vapor pressures than comparable acetamidinates and guanidinate analogues, appropriate metal center shielding and well governed surface as well as gas phase reactions that synergistically affect the deposition with desired conformality, by use of formamidinate ligands. The present heteroleptic formamidinate compounds provide the deposition of cleaner films that are free of deposits, particles, and surface defects such as roughness and compositional non-uniformity as compared to conventional amidinate and guanidinate compounds. The present heteroleptic formamidinate compounds also have longer shelf life and reduced safety issues as compared to these conventional compounds. In particular, aromatic heteroleptic formamidinate compounds are expected to eliminate the need of external solvents for cleaning the films during deposition, as stable aromatic (i.e. aryl comprising) solvents are expected to be generated in situ during ALD growth using these sources.

The following examples are expected to illustrate various aspects of the present invention.

EXAMPLE 1

Di-iso-propylformidine was synthesized according to the process of Zhang et al., *Organometallics*, 2004 (23) pg. 3512. A solution of mixture of di-iso-propylcarbodiimide (0.5 mol) and triethylsilane (0.6 mol) were sealed with palladium chloride (1 to 2%) in a pressure vessel at atmospheric pressure and under inert atmosphere. Then the pressure vessel was heated to 150° C. in an oil bath for 48 hours with constant magnetic stirring. After the mixture was cooled to room temperature, the intermediate silyl-protected formamidine was distilled out of the reaction mixture under reduced pressure (0.7 torr, 93 Pa) at 80° C. To the freshly distilled intermediate was then added dry methanol (0.53 mol). After 1.5 hr, the final solid was distilled out under reduced pressure. The yield was approximately 30 to 40%.

EXAMPLE 2

Di-iso-propylformidine acetate was synthesized as follows. A mixture of triethylorthoformate (503 g, 3.4 mol) and acetic acid (204 g, 3.4 mol) was refluxed under inert atmosphere at 130 to 140° C. Following completion of the reaction, isopropylamine (590 ml, 6.8 mol) was added in dropwise manner and refluxed for additional 1.5 hours. The volatiles were distilled of at 155° C. The product, di-isopropylformamidine acetate, was distilled at 90° C. and 0.7 Torr (93 Pa) pressure.

The di-isopropylformamidine acetate was added to freshly prepared alkali metal alkoxide solution in the corresponding alcohol (ca 50%) at 80° C. under inert atmosphere. The crude product, di-isopropylformamidine was distilled from the reaction mixture at 80° C. and at 1 Torr (133 Pa) pressure. The product was further purified by second distillation at 50° C. at 4 Torr (533 Pa) pressure. The overall yield was 65%.

EXAMPLE 3

Di-iso-propylformidinato lithium was synthesized as follows. The lithium salt of di-iso-propylformidine was prepared by reacting at −78° C. a hexane solution of n-butyl-lithium (2.3 M in hexane) with an equimolar quantity of di-iso-propylformidine dissolved in an ethereal solvent. The addition was carried out in a dropwise manner and with efficient stirring. After completing the addition, the reaction mixture was allowed to attain room temperature. The solvents and unreacted reagents were removed using vacuum stripping. The yield of final product, a white solid, was greater than 92%.

EXAMPLE 4

Di-methylformidinato lithium is expected to be synthesized using the procedures of Examples 1 and 3, by replacing di-iso-propylcarbodiimide with dimethylcarbodiimide.

EXAMPLE 5

Di-tert-butylformidinato lithium is expected to be synthesized using the procedures of Examples 1 and 3, by replacing di-iso-propylcarbodiimide with di-tert-butylcarbodiimide.

EXAMPLE 6

Unsymmetrical 1-tert-butyl-3-ethylformidinato lithium is expected to be synthesized using the procedures of Examples 1 to 3, by replacing di-iso-propylcarbodiimide with 1-tert-butyl-3-ethylcarbodiimide.

EXAMPLE 7

Bis(di-tert-butylformidinato)rutheniumdicarbonyl, Ru(tert-Bu$_2$-FAMD)$_2$(CO)$_2$, is expected to be synthesized by reacting [RuCl$_2$(CO)$_3$(C$_4$H$_8$O)] (16.5 g, 50 mmol) with freshly prepared Li(tert-Bu$_2$-FAMD) (16.4 g, 101 mmol) in THF (350 ml). The reaction mixture is stirred overnight and then concentrated under vacuum. The residue is extracted with hexanes and filtered through celite. The filtrate is then concentrated to afford the crude material, which is expected to be purified by sublimation to afford a pure solid product.

EXAMPLE 8

Bis(di-iso-propylformidinato)bis(ethylmethylamido)zicronium, Zr(iso-Pr$_2$-FAMD)$_2$(NEtMe)$_2$, is expected to be synthesized by adding the solution of di-isopropyl formamidine, iso-Pr$_2$-FAMDH (0.3 mol, 1.03 eq.) in toluene to a solution of tetrakis(ethylmethylamido)zirconium ("TEMAZr") (0.146 mol) in toluene at −30° C. The reaction mixture is allowed to slowly warm up to room temperature and reacted for another 5 hours. The solvent and other volatiles are expected to be removed by vacuum. The final solid product is expected to be isolated by sublimation, and further purified by sublimation or extraction or crystallization or the combination thereof.

EXAMPLE 9

(Di-iso-propylformidinato)tris(ethylmethylamido)zicronium, Zr(iso-Pr$_2$-FAMD)(NEtMe)$_3$, is expected to be synthesized by adding the solution of di-isopropyl formamidine, (0.15 mol, 1.03 eq.) in toluene to the solution of TEMAZr (0.146 mol) in toluene at −30° C. The reaction mixture is then allowed to slowly warm up to room temperature and reacted for another 5 hours. The solvent and other volatiles are expected to be removed by vacuum and the final solid product is isolated by sublimation as in Example 8.

EXAMPLE 10

Organometallic heteroleptic formamidinate compounds of the formula $(R^1NC(H)NR^2)_n M^{+m} L^1_{(m-n)} L^2_p$ listed in the following table are expected to be prepared according to the procedures provided in Examples 1 through 9.

| Sample | M  | $R^1$ | $R^2$ | $L^1$   | $L^2$       |
|--------|----|-------|-------|---------|-------------|
| A      | Mg | DMA   | Et    | Cp      | —           |
| B      | Ga | Et    | Et    | DAA     | —           |
| C      | Si | t-Am  | t-Bu  | PAMD    | —           |
| D      | Te | i-Pr  | t-Bu  | Allyl   | —           |
| E      | Ge | i-Pr  | i-Pr  | EMA     | —           |
| F      | Sc | Et    | Me    | TMG     | —           |
| G      | La | i-Pr  | i-Pr  | Cp      | —           |
| H      | Zr | i-Pr  | —     | MeCp    | —           |
| I      | Hf | Me    | i-Pr  | Allyl   | isoprene    |
| J      | Nb | DMA   | i-Pr  | DMA     | —           |
| K      | Ta | s-Bu  | s-Bu  | Cp      | —           |
| L      | W  | Me    | Me    | Cp, DAA | —           |
| M      | Ni | s-Bu  | t-Bu  | Cp      | Bz, CO      |
| N      | Ru | t-Bu  | t-Bu  | EtCp    | p-cymene, CO|
| O      | Ru | s-Bu  | t-Bu  | EtCp    | CO, COD     |
| P      | Ru | t-Bu  | t-Bu  | MeCp    | CO          |
| Q      | Pt | Me    | Me    | DAA     | —           |

In the above table, ligands separated by a comma denote that each ligand is present in that compound.

EXAMPLE 11

Compositions suitable for use in ALD or direct liquid injection processes are prepared by combining certain of the compounds of Example 11 with certain organic solvents. The particular compositions are shown in the following table. The organometallic compounds are typically present in a concentration of 0.2 M for direct liquid injection.

| Composition Sample | Organometallic Compound Sample | Solvent |
|---|---|---|
| 1  | H | Biphenyls |
| 2  | I | Diphenyl Ethers |
| 3  | D | n-Butyl acetate |
| 4  | E | Octane |
| 5  | G | PMDETA |
| 6  | E | PMDETA |
| 7  | F | THF |
| 8  | F | Octane |
| 9  | G | Butyl Tetraglyme |
| 10 | G | 2-Methoxyethoxy acetate |
| 11 | H | n-Butyl acetate |
| 12 | H | Linear alkyl benzene |
| 13 | J | Butyl Tetraglyme |
| 14 | K | Octane |
| 15 | K | Butyl Tetraglyme |
| 16 | M | n-Butyl acetate |
| 17 | M | 2-Methoxyethoxy acetate |
| 18 | O | Octane |
| 19 | O | THF |

EXAMPLE 12

It is expected that deposition of zirconium oxide using bis(di-iso-propylformidinato)bis(ethylmethylamido)zicronium $[Zr(iso-Pr_2-FAMD)_2(NEtMe)_2]$ as the zirconium precursor and a suitable oxygen source, such as $H_2O$, $O_2$ or ozone, by means of ALD. Typically the precursor may be delivered to a hot (generally 200° C. to 400° C.) substrate, such as silicon, silicon dioxide, Ta or TaN in pulses alternating with pulses of the suitable oxygen source. The zirconium precursor may be delivered to the substrate by a suitable means, such as conventional bubbling of carrier gas.

What is claimed is:

1. A method of forming a metal-containing layer on a substrate comprising: providing a substrate in a vapor deposition reactor; conveying a heteroleptic formamidinate compound in a gaseous form to the reactor; and depositing a film comprising a metal on the substrate; wherein the heteroleptic formamidinate compound comprises a metal, a formamidinate ligand and an anionic ligand.

2. The method of claim 1 wherein the heteroleptic formamidinate compound has the formula $(R^1NC(H)NR^2)_n M^{+m} L^1_{(m-n)} L^2_p$, wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-alkyl)amino, di(alkyl-silyl)amino, disilylamino, alkylalkoxy, alkoxyalkyl and aryl; M=a metal; $L^1$=an anionic ligand; $L^2$=a neutral ligand; m=the valence of M; n=1-6; p=0-3; and wherein m is greater than n.

3. The method of claim 2 wherein $L^1$ is chosen from hydride, halide, azide, alkyls, alkenyl, alkynyl, amino, alkylamino, dialkylamino, di(silyl-substituted alkyl)amino, disilylamino, di(alkyl-substituted silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, pyrazolates, guanidinates, phosphoguanidinates, amidinates, and phosphoamidinates.

4. The method of claim 2 wherein $L^2$ is chosen from CO, NO, alkenes, dienes, trienes, alkynes, and aromatic compounds.

5. The method of claim 2 wherein M is chosen from a Group 2 to Group 16 metal.

6. A method of depositing a film comprising the steps of: providing a substrate in a vapor deposition reactor; conveying as a first precursor a heteroleptic formamidinate compound in a gaseous form to the reactor; chemisorbing the first precursor compound on the surface of the substrate; removing any non-chemisorbed first precursor compound from the reactor; conveying a second precursor in a gaseous form to the reactor; reacting the first and second precursors to form a film on the substrate; and removing any unreacted second precursor, wherein the heteroleptic formamidinate compound comprises a metal, a formamidinate ligand and an anionic ligand.

7. The method of claim 6 wherein the heteroleptic formamidinate compound has the formula $(R^1NC(H)NR^2)_n M^{+m} L^1_{(m-n)} L^2_p$, wherein $R^1$ and $R^2$ are independently chosen from H, $(C_1-C_6)$alkyl, $(C_2-C_6)$alkenyl, $(C_2-C_6)$alkynyl, $(C_3-C_8)$cycloalkyl, dialkylaminoalkyl, monoalkylamino, dialkylamino, di(silyl-substituted alkyl)amino, di(alkyl-substituted silyl)amino, disilylamino, alkylalkoxy, alkoxyalkyl and aryl; M=a metal; $L^1$=an anionic ligand; $L^2$=a neutral ligand; m=the valence of M; n=1-6; p=0-3; and wherein m is greater than n.

8. The method of claim 7 wherein $L^1$ is chosen from hydride, halide, azide, alkyls, alkenyl, alkynyl, amino, alkylamino, dialkylamino, di(silyl-alkyl)amino, disilylamino, di(alkyl-silyl)amino, dialkylaminoalkyl, hydrazido, phosphido, nitrile, alkoxy, dialkylaminoalkoxy, alkoxyalkyldialkylamino, siloxy, diketonates, cyclopentadienyls, silyls, pyrazolates, guanidinates, phosphoguanidinates, amidinates, and phosphoamidinates.

9. The method of claim 7 wherein M is chosen from a Group 2 to Group 16 metal.

10. The method of claim 7 wherein the second precursor is selected from oxygen, ozone, water, peroxide, alcohols, nitrous oxide and ammonia.

* * * * *